United States Patent [19]

Beaty et al.

[11] Patent Number: 5,040,095
[45] Date of Patent: Aug. 13, 1991

[54] THERMALLY CONTROLLED EQUIPMENT CABINET

[75] Inventors: Robert C. Beaty; Michael Caputo, both of Raleigh, N.C.

[73] Assignee: Alcatel NA Network Systems Corp., Raleigh, N.C.

[21] Appl. No.: 518,150

[22] Filed: May 3, 1990

[51] Int. Cl.$^5$ .............................................. H05K 7/20
[52] U.S. Cl. ..................................... 361/384; 361/390
[58] Field of Search ........................... 165/50.3, 104.33; 174/15.1, 16.1; 361/383, 395, 384–399, 391

[56] References Cited

U.S. PATENT DOCUMENTS 4,665,466  5/1987  Green .................................. 361/384
4,949,218  8/1990  Blanchard et al. ................. 361/384

FOREIGN PATENT DOCUMENTS 0145212  6/1985  European Pat. Off. ............ 361/383

Primary Examiner—Gregory D. Thompson
Attorney, Agent, or Firm—Peter C. Van Der Sluys

[57] ABSTRACT

A thermally controlled equipment cabinet for telephone systems has a gas-tight, sealed compartment for mounting sensitive active electronic components and has jacket 20 partially encompassing at least three sides of the sealed compartment. The sealed compartment utilizes either forced or natural convection to dissipate the heat generated by the components to the surrounding air. The heat is then dissipated to the ambient air through a highly heat-conductive corrugated roof and side panels. The jacket provides a cooling air passage around the sealed compartment and over the corrugated roof removing heat thereof. Nonsensitive passive components, mounted in the cooling air passage near the air inlet of the jacket, provide protrusions in the cooling air passage causing a slightly turbulent air flow in the passage thereby enhancing heat transfer. Storage batteries, such as used in telephone systems, are mounted within the cooling air passage near the air exhaust of the jacket. The warmer air allows the batteries operate at higher and more efficient operating temperatures.

19 Claims, 1 Drawing Sheet

U.S. Patent  Aug. 13, 1991  5,040,095

# THERMALLY CONTROLLED EQUIPMENT CABINET

BACKGROUND OF THE INVENTION

1. Field of the Invention

The present invention relates to air cooled equipment cabinets and more particularly to electronic equipment enclosures for housing sensitive and nonsensitive electronic components such as those used by telephone companies.

2. Description of the Prior Art

Electronic equipment cabinets are used to house electronic components, such as those mounted on circuit boards. Active components produce heat which must be dissipated from the cabinet for the circuitry to operate properly. Heat dissipation may accomplished by forcing outside ambient air through the housing by blowers or fans to remove the heat generated by the components. There is a problem with this technique, however, in that it exposes the components to airborne contaminants and uncontrolled humidity. Sensitive electronic components may not operate effectively under those conditions.

Sealed compartments are utilized to isolate the sensitive active components of the electronic circuitry from the outside ambient air. Fans mounted within the sealed compartments circulate the air. The heat generated by the active components is transferred to the ambient air via the exterior skin of the compartment. Natural or forced convection may be utilized to remove the heat therefrom.

A problem can result if the sealed electrical compartment is subject to direct sunlight. Sunlight subjects the compartment to solar loading which may severely limit heat dissipation therefrom of and even increase the temperature in the compartment.

In some instances, a jacket is placed around the sealed compartment to form a cooling air passage. Cooling air is forced into the jacket and through the cooling passage by blowers or fans. This increases the heat dissipation from the sealed compartment. The jacket also acts as a solar shield, blocking sunlight which might come into contact with the compartment.

Other air cooled electronic cabinets utilize a sealed compartment with one or more corrugated walls. The corrugation enlarges the surface area from which convection can occur, thus increasing heat dissipation.

In some electrical systems, and in particular telephone systems, nonsensitive passive components, such as fuses and lightning suppressors, are used in addition to sensitive active electrical components. Because these components are nonsensitive to an ordinary amount of airborne contaminants, they do not need to be isolated from the ambient air. In addition, telephone systems utilize a number of storage batteries which provide the DC current for the telephone system. Batteries are also nonsensitive and therefore do not require ambient air isolation. Additionally, batteries operate more effectively in an environment somewhat above ambient temperatures.

SUMMARY OF THE INVENTION

The present invention contemplates a thermally controlled equipment cabinet, most specifically applicable in telephone systems, which utilizes a sealed compartment for ambient air isolation of sensitive active components and uses a jacket which partially encompasses the exterior of the sealed compartment thus forming a cooling air passage between the jacket and the compartment. The sealed compartment is provided with at least one corrugated surface which is partially encompassed by the jacket to provide a greater surface area for heat dissipation to occur between the sealed compartment and the air passages defined by the jacket.

The jacket is provided with an inlet through which the ambient air is allowed to enter the cooling air passage and an exhaust through which the warmed cooling air is forced out of the cooling air passage. A blower, mounted within the cooling air passage, circulates the cooling air around the outside perimeter of the sealed compartment. The jacket also acts as a solar shield for the sealed compartment by blocking any sunlight which might come into contact with the compartment.

Within the cooling air passage, nonsensitive passive components, such as fuses and lightning suppressors, are mounted near the inlet. By placing these nonsensitive passive components outside of the sealed compartment, circulation of the air within the compartment, normally fan-blown, is less restricted. Additionally, by placing these components in the cooling air passage, laminar or streamlined flow of cooling air is disrupted. This causes a slight turbulence in the air flow thereby enhancing heat dissipation from the sealed compartment to the cooling air.

Storage batteries, such as those used in telephone systems, are also mounted in the cooling air passage. The batteries, however, are mounted near the exhaust. The cooling air, which has been warmed by heat dissipation from the sealed compartment, provides a warmer operating environment where the batteries may operate most efficiently.

A primary objective of the present invention is to provide a thermally controlled equipment cabinet for telephone systems for housing sensitive and nonsensitive electronic components whereby the sensitive components are isolated from the ambient air.

Another objective of the present invention is to provide a thermally controlled equipment cabinet with a sealed casing for isolating the sensitive components, partially encompassed by a jacket for providing a cooling air passage between the sealed compartment and the jacket.

Another objective of the present invention is to provide an equipment cabinet having a sealed compartment having at least one corrugated wall of highly conductive material for maximal heat transfer.

Another object of the present invention is to provide an equipment cabinet in which nonsensitive components are mounted externally to the sealed compartment in the cooling air passage near the air inlet thereby providing protrusions in the passage.

Another objective of the present invention is to provide an equipment cabinet in which batteries are mounted externally to the sealed compartment in the cooling air passage near the exhaust thereby heating the batteries to a higher and more efficient operating temperature.

The above and other objectives and advantages of the invention will become more apparent upon reading the description of the invention in connection with the drawing described below.

DESCRIPTION OF THE PREFERRED EMBODIMENT

Figure 2:
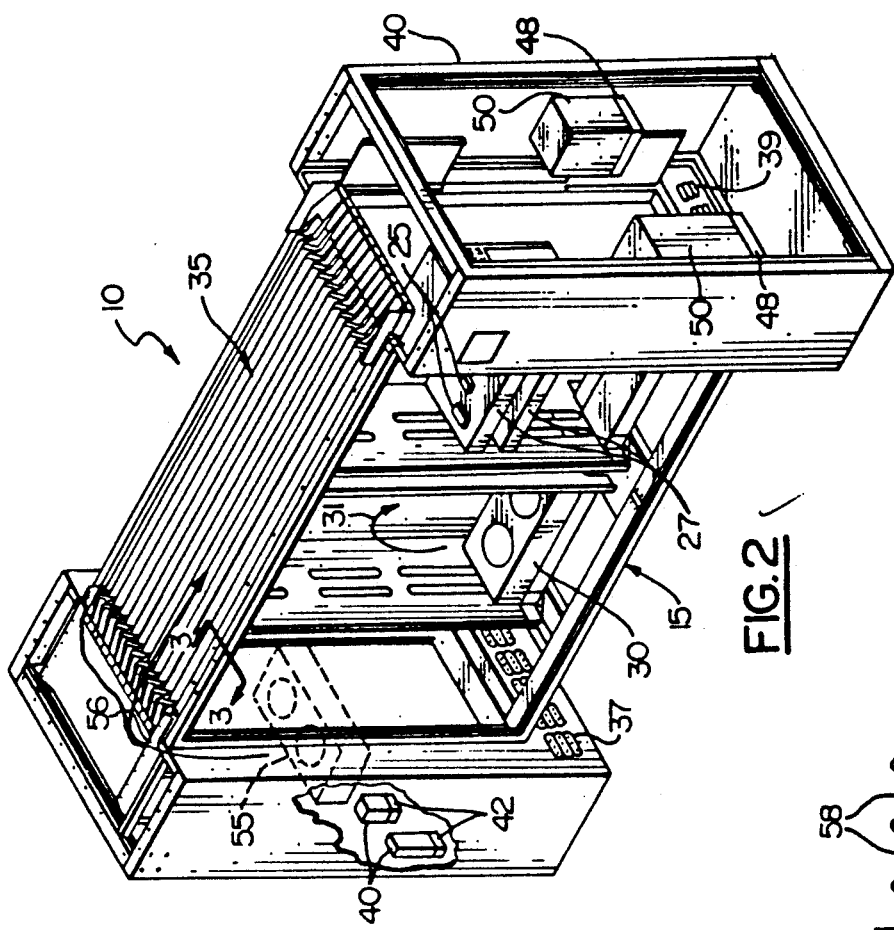
FIG. 2 is an isometric view of the thermally controlled equipment cabinet of the present invention shown with top and sides partially removed.
Figure 1:
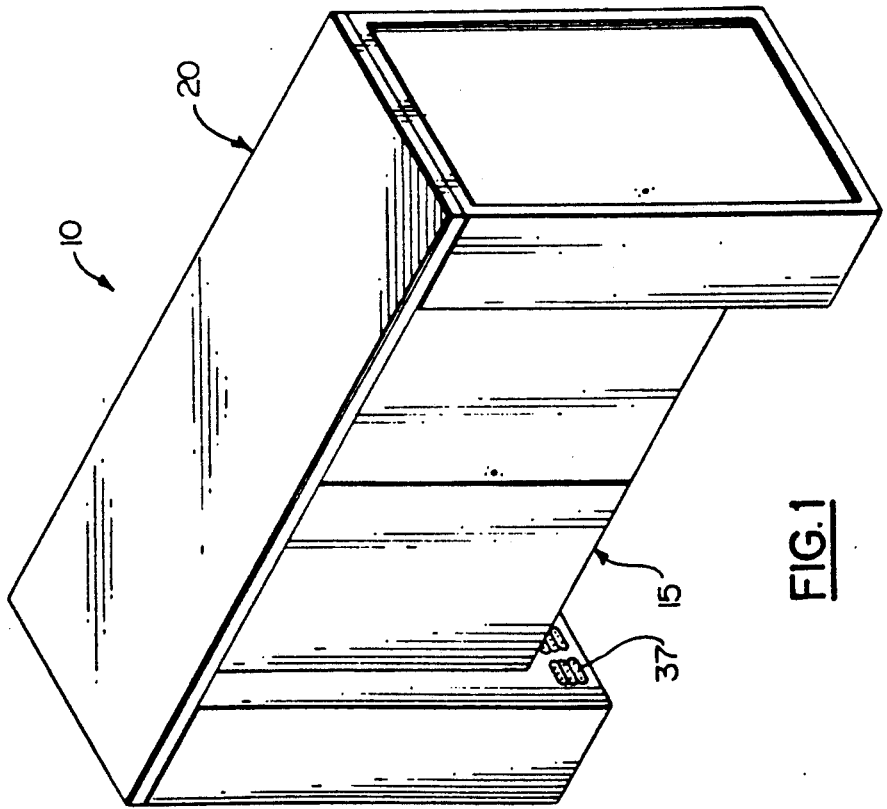
FIG. 1 is an isometric view of the thermally controlled equipment cabinet of the present invention.

FIG. 1 illustrates the thermally controlled equipment cabinet 10 of the present invention. Cabinet 10 is comprised of two fundamental parts: (1) a sealed, gas-tight compartment 15, and (2) a jacket 20 which is formed around at least one side of the compartment 15. As shown in FIG. 2, the sealed compartment 15 is utilized to house active electronic components 25, which in many instances are mounted on circuit boards 27. The components 25 require ambient air isolation provided by the compartment 15 because they may be sensitive to airborne contaminants and uncontrolled humidity.

Because they are active, components 25 generate a considerable amount of heat. This heat must be dissipated from the components 25 so that they may operate properly. This is accomplished through natural or forced convection.

Natural convection occurs within the sealed compartment 15 when the heat from the active components 25 rises to the top of the compartment 15. The heat warms the corrugated roof 35 of the compartment 15 and is dissipated into the ambient air external to the compartment 15. This naturally upward movement of the hot air generated by the components 25 displaces the cooler air from the top of the compartment 15 and ultimately forces the cooler air in a downward direction. The cooler air is then warmed by the components 25 and rises to the top of the compartment 15, displacing any cooler air. This continuous circulation of hot and cold air within the compartment 15 provides limited cooling to the components 25.

Forced convection can be achieved through the use of a fan or blower 30 within the compartment 15. The fan 30 circulates the air within the compartment 15 as shown by arrow 31. This enhances the cooling of the components 25 and the sealed compartment 15.

Figure 3:
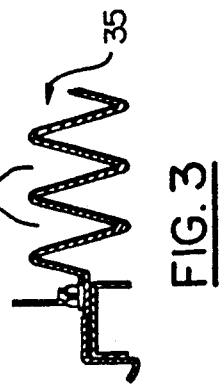
FIG. 3 is a partial cross-sectional view of the corrugated roof taken along line 3—3 as shown in FIG. 2.

The heat within the compartment 15 is dissipated to the outside of the compartment through highly heat conductive side and top panels. Corrugated panels, such as corrugated roof 35, provide more surface area than flat planar panels allowing a greater amount of heat to dissipate to the ambient air. FIG. 3 illustrates the corrugated roof 35 in an enlarged cross-section. The roof 35 and sides 36 are in a thermally conductive relation with the interior of the sealed compartment 15.

Referring again to FIG. 1, the jacket 20, which is formed about three sides of the sealed compartment 15, provides a cooling air passage about the sealed compartment. The jacket 20, which may be comprised of a metal or a plastic, allows for cooling air to be forced past the corrugated roof 35 thus enhancing the dissipation of heat from the sealed compartment 15 to the air in the cooling air passage.

As shown in FIG. 2, an air inlet 37 is located on the inlet side 38 of the cabinet 10. The inlet 37 allows the cooler ambient air to enter into the cooling air passage. An air exhaust 39 is located on the exhaust side 40 of the cabinet 10. A fan 55 positioned within the cooling air passage, draws cooler ambient air into the cooling air passage through the air inlet 37 and circulates the air past the corrugated roof 35 and out the air exhaust 39 as indicated by arrows 56. As air passes through cooling air channels 58 of corrugated roof 35 as shown in FIG. 3, the cooling air warms through an air/air heat exchange. The warmer air is forced out of the air exhaust 39, shown in FIG. 2, where the heat is dissipated externally to the equipment cabinet 10.

Within the cooling air passage on the inlet side 38, nonsensitive passive electrical components 40, such as fuses and lightning suppressors, may be mounted in proximity to the air inlet 37 within housings 42. By mounting these passive components 40 external to the sealed compartment 15, space within the compartment 15 is conserved thereby allowing a more continuous air flow within the sealed compartment 15. In addition, the passive components 40 provide protrusions in the cooling air passage which disrupt the laminar or streamlined flow of the cooling air. The resulting turbulent flow enhances the heat transfer capabilities of the cabinet.

Within the cooling air passage on the exhaust side 40, housings 48 for batteries 50 are located in proximity to the air exhaust 39. Storage batteries 50, such as those used in telephone systems, may be mounted within the housings 48. The warmer cooling air is forced past the storage batteries 50 thereby warming the batteries 50 to a higher and more efficient operating temperature. The batteries, like the passive components 40, act as protrusions in the cooling air passage causing a turbulent cooling air flow thereby enhancing the cabinet's heat dissipation capabilities. The cooling air is then forced out of the air passage through the air exhaust 39.

What is claimed is:

1. A thermally controlled equipment cabinet comprising:
   a compartment for enclosing electronic components, said compartment having a plurality of walls in thermally conductive relation with an interior of the compartment;
   a jacket at least partially encompassing the exterior of at least one wall of said compartment forming a cooling air passage between said jacket and said compartment, said jacket having an inlet and an exhaust for ambient air;
   means for mounting electrical components within said cooling air passage; and
   means associated with said cooling air passage for circulating air through said cooling air passage.

2. A thermally controlled equipment cabinet as described in claim 1, wherein said electrical components are nonsensitive to ambient air.

3. A thermally controlled equipment cabinet as described in claim 2, wherein said electrical components comprise passive components, said passive components being mounted in said mounting means near said inlet.

4. A thermally controlled equipment cabinet as described in claim 3, wherein said electrical components further comprise batteries, said batteries being mounted in said mounting means near said exhaust.

5. A thermally controlled equipment cabinet as described in claim 4, wherein said jacket at least partially encompasses the exterior of at least three walls of said compartment.

6. A thermally controlled equipment cabinet as described in claim 5, wherein said inlet is located on a first side of said cabinet and said exhaust is located on a second side of said cabinet.

7. A thermally controlled equipment cabinet as described in claim 6, wherein said passive components are mounted on said first side of said jacket and said batteries are mounted on said second side of said jacket.

8. A thermally controlled equipment cabinet as described in claim 1, wherein said at least one wall of said compartment is corrugated.

9. A thermally-controlled equipment cabinet, comprising:
an airtight compartment for enclosing electronic components, said compartment having a plurality of walls in thermally conductive relation with an interior of the compartment;
a jacket at least partially encompassing the exterior of at least one wall of said compartment forming a cooling air passage between said jacket and said compartment, said jacket having an inlet and an exhaust for ambient air;
means for mounting electrical components within said cooling air passage; and
means associated with said cooling air passage for circulating air through said cooling air passage.

10. A thermally controlled equipment cabinet as described in claim 9, wherein said electronic components are sensitive to ambient air.

11. A thermally controlled equipment cabinet as described in claim 10, wherein said at least one wall of said compartment is corrugated.

12. A thermally-controlled equipment cabinet, comprising:
a compartment for enclosing electronic components, said compartment having a plurality of walls in thermally conductive relation with an interior of the compartment;
a jacket at least partially encompassing the exterior of at least three walls of said compartment forming a cooling air passage between said jacket and said compartment, said jacket having an inlet and an exhaust for ambient air;
means for mounting electrical components within said cooling air passage; and
means associated with said cooling air passage for circulating air through said cooling air passage.

13. A thermally controlled equipment cabinet as described in claim 12, wherein said inlet is located on a first side of said cabinet and said exhaust is located on a second side of said cabinet.

14. A thermally controlled equipment cabinet as described in claim 13, wherein said passive components are mounted on said first side of said jacket and said batteries are mounted on said second side of said jacket.

15. A thermally controlled equipment cabinet as described in claim 14, wherein said circulating means is a fan.

16. A thermally controlled equipment cabinet as described in claim 8, wherein said electronic components are active.

17. A thermally controlled equipment cabinet as described in claim 16, wherein said compartment is airtight.

18. A thermally controlled equipment cabinet as described in claim 17, wherein said electronic components are sensitive to ambient air.

19. A thermally controlled equipment cabinet as described in claim 18, wherein said at least one wall of said compartment is corrugated.

* * * * *